United States Patent
Nam

(10) Patent No.: US 8,058,637 B2
(45) Date of Patent: Nov. 15, 2011

(54) PHASE CHANGE MEMORY DEVICE AND METHOD FOR MANUFACTURING THE SAME

(75) Inventor: Ki Bong Nam, Seoul (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 179 days.

(21) Appl. No.: 12/346,306

(22) Filed: Dec. 30, 2008

(65) Prior Publication Data

US 2010/0117043 A1 May 13, 2010

(30) Foreign Application Priority Data

Nov. 10, 2008 (KR) .................. 10-2008-0111256

(51) Int. Cl.
*H01L 29/02* (2006.01)
(52) U.S. Cl. ............... 257/2; 257/910; 257/E47.001; 365/163
(58) Field of Classification Search ............ 257/2, 910, 257/E47.001; 365/163
See application file for complete search history.

(56) References Cited

U.S. PATENT DOCUMENTS

| | | | | |
|---|---|---|---|---|
| 5,359,219 | A | * | 10/1994 | Hwang .................. 257/351 |
| 7,589,367 | B2 | * | 9/2009 | Oh et al. ................ 257/296 |
| 2007/0173010 | A1 | | 7/2007 | Lee et al. |
| 2009/0161406 | A1 | | 6/2009 | Chuang et al. |

FOREIGN PATENT DOCUMENTS

| KR | 1020060094424 A | 8/2006 |
|---|---|---|
| KR | 1020090088009 A | 8/2009 |

* cited by examiner

*Primary Examiner* — Tan N Tran
(74) *Attorney, Agent, or Firm* — Ladas & Parry LLP

(57) ABSTRACT

A phase change memory device includes a semiconductor substrate having a first conductivity type well An isolation structure is formed in the semiconductor substrate having the first conductivity type well to define active regions. Second conductivity type high concentration areas are formed in surfaces of the active regions. Insulation patterns are formed under the second conductivity type high concentration areas to insulate the second conductivity type high concentration areas from the first conductivity type well. A plurality of vertical diodes are formed on the second conductivity type high concentration areas which are insulated from the first conductivity type well.

26 Claims, 14 Drawing Sheets

PHASE CHANGE MEMORY DEVICE AND METHOD FOR MANUFACTURING THE SAME

CROSS-REFERENCE TO RELATED APPLICATIONS

The present application claims priority to Korean patent application number 10-2008-0111256 filed on Nov. 10, 2008, which is incorporated herein by reference in its entirety.

BACKGROUND OF THE INVENTION

The present invention relates generally to a phase change memory device and a method for manufacturing the same, and more particularly, to a phase change memory device for preventing a decrease in the current applied to vertical PN diodes serving as cell switching elements in a cell region and a method for manufacturing the same.

Typical memory devices largely fall into the category of volatile random access memory (RAM), in which inputted information is lost when power is interrupted, and non-volatile read-only memory (ROM), in which the stored state of information can be maintained even when power is interrupted. Examples of volatile RAM include dynamic RAM (DRAM) and static RAM (SRAM), and examples of non-volatile ROM include flash memory devices, such as an electrically erasable and programmable ROM (EEPROM).

DRAM is generally considered an excellent memory device; however, DRAM must have a high charge storing capacity, which can be realized by increasing the surface area of an electrode. However, increasing the surface area of an electrode leads to difficulty in accomplishing a high level of integration. Further, in a flash memory device, two gates are stacked on each other, and therefore an operation voltage that is high in comparison to the power supply voltage is necessary. As such, in a flash memory device a separate booster circuit is needed to generate the voltage necessary for write and delete operations, which in turn leads to difficulty in accomplishing a high level of integration.

These constraints are often problematic, as the semiconductor industry continues to drive for a memory device having a simple configuration and capable of accomplishing a high level of integration while retaining the characteristics of a non-volatile memory device. One example of a memory device considered as having potential is the phase change memory device. In the phase change memory device, a phase change layer is interposed between a bottom electrode and a top electrode. In order to store information, in the phase of the phase change layer can be changed between a crystalline state and an amorphous state by causing current to flow between the bottom electrode and the top electrode. The electrical resistivity of the amorphous state and the crystalline state are different, and therefore the information stored in a cell can be recognized, for example, by comparing the resistance of the phase change layer to the medium of the difference in resistance between the crystalline state and the amorphous state.

One of the most important factors that must be considered when developing a phase change memory device is the reduction of programming current. In this regard, recently developed phase change memory devices employ vertical PN diodes, which have a high degree of current flow, as cell switching elements in place of NMOS transistors. Because current flow can be increased and the size of cells can be decreased by employing the vertical PN diodes, it is possible to realize a highly integrated phase change memory device.

However, in a conventional phase change memory device employing vertical PN diodes, problems occur since undesired parasitic PNP bipolar junction transistors are formed between the vertical PN diodes and a p-well of the substrate, and thus current is not entirely transmitted to a phase change layer and can leak to the p-well.

In detail, FIG. 1 is a cross-sectional view for illustrating a conventional phase change memory device in which vertical PN diodes are used as cell switching elements and undesired parasitic PNP bipolar junction transistors are formed. Referring to FIG. 1, a high voltage is applied from a bit line 130 to a vertical PN diode 110, and a low voltage that is lower than the voltage applied to the vertical PN diode 110 is applied through a word line 132. As such, electrons flow from the word line 132 functioning as a low voltage terminal to a phase change layer 114 functioning as a high voltage terminal. The flow of electrons causes the temperature of the phase change layer 114 to change so that a phase change occurs in the phase change layer 114.

However, an undesired parasitic PNP bipolar transistor is created between the vertical PN diode 110 and a p-well 102. As a consequence, the electrons discharged from the low voltage terminal do not entirely flow to the vertical PN diode 110 and flow also to the p-well 102. Accordingly, when the conventional phase change memory device operates, current efficiency deteriorates.

In FIG. 1, reference numeral 100 designates a semiconductor substrate, 106 a well pick-up, 134 a metal line which includes the contact plug connected to the well pick-up 106, 104 an N+ base area, 112 a bottom electrode, and 116 a top electrode.

FIG. 2 is a graph shown for explaining the current loss in the conventional phase change memory device caused by the undesired parasitic PNP bipolar transistor. In the graph, 'line a' indicates the current flowing to the phase change layer when the bias of the p-well is grounded to 0V, and 'line b' indicates the current flowing to the phase change layer when the p-well is floated such that current cannot flow to the p-well.

When referring to the graph, it can be appreciated that there is a difference in the amount of current flow between the case in which the bias of the p-well is grounded to 0V and the case in which the p-well is floated. The difference in the amount of current flow corresponds to the amount of current which discharges through the p-well.

Therefore, as shown the efficiency of operation current in the conventional phase change memory device which adopts the vertical PN diodes as cell switching elements is decreased by the by the undesired parasitic PNP bipolar transistor.

SUMMARY OF THE INVENTION

Embodiments of the present invention include a phase change memory device which can prevent current from flowing to a p-well in a cell region, and a method for manufacturing the same.

Additionally, embodiments of the present invention include a phase change memory device which can cause an operation current to entirely (or to substantially) flow to vertical PN diodes serving as cell switching elements in a cell region, thereby preventing the current of the vertical PN diodes from decreasing, and a method for manufacturing the same.

Further, embodiments of the present invention include a phase change memory device having improved operation characteristics, and a method for manufacturing the same.

In one aspect of the present invention, a phase change memory device includes a semiconductor substrate having a first conductivity type well; an isolation structure formed in the semiconductor substrate having the first conductivity type well to define active regions; second conductivity type high concentration areas formed in surfaces of the active regions; insulation patterns formed under the second conductivity type high concentration areas to insulate the second conductivity type high concentration areas from the first conductivity type well; and a plurality of vertical diodes formed on the second conductivity type high concentration areas which are insulated from the first conductivity type well.

The first conductivity type may be a P-type, and the second conductivity type may be an N-type.

The active regions may be bar type active regions.

The plurality of bar type active regions may extend in a first direction and may be spaced apart from one another in a second direction perpendicular to the first direction.

The insulation patterns may include at least one of an oxide layer and a nitride layer.

The vertical diodes may have a structure in which a first conductivity type area and a second conductivity type area are stacked in the shape of patterns.

The phase change memory device may further include bottom electrodes, a phase change layer and top electrodes stacked on the vertical diodes.

The bottom electrodes may have the shape of a dot pattern.

The phase change layer and the top electrodes may have the shape of line type stack patterns.

In another aspect of the present invention, a phase change memory device comprises a semiconductor substrate divided into a cell region and a peripheral region and having a first conductivity type well which is shared by the cell region and the peripheral region; an isolation structure formed in and between the regions of the semiconductor substrate having the first conductivity type well in such a way as to define a plurality of active regions; second conductivity type high concentration areas formed in surfaces of the respective active regions of the cell region; insulation patterns formed under the second conductivity type high concentration areas to insulate the second conductivity type high concentration areas from the first conductivity type well; a plurality of vertical diodes formed on the second conductivity type high concentration areas which are insulated from the first conductivity type well; and bottom electrodes, a phase change layer and top electrodes stacked on the respective vertical diodes.

The first conductivity type may be a P-type, and the second conductivity type may be an N-type.

The active regions may be bar type active regions. The plurality of bar type active regions extend in a first direction and are spaced apart from one another in a second direction perpendicular to the first direction.

The insulation patterns may include at least one of an oxide layer and a nitride layer.

The vertical diodes may have a structure in which a first conductivity type area and a second conductivity type area are stacked in the shape of patterns.

The bottom electrodes may have the shape of dot patterns.

The phase change layer and the top electrodes have the shape of line type stack patterns.

In another aspect of the present invention, a method for manufacturing a phase change memory device includes the steps of forming an isolation structure in a semiconductor substrate having a first conductivity type well to define active regions; forming second conductivity type high concentration areas in surfaces of the active regions; forming insulation patterns under the second conductivity type high concentration areas to insulate the second conductivity type high concentration areas from the first conductivity type well; and forming a plurality of vertical diodes on the second conductivity type high concentration areas which are insulated from the first conductivity type well.

The first conductivity type may be a P-type, and the second conductivity type may be an N-type.

The active regions may be formed into bar type active regions.

The plurality of bar type active regions may formed such that they extend in a first direction and are spaced apart from one another in a second direction perpendicular to the first direction.

The insulation patterns may include at least one of an oxide layer and a nitride layer.

The vertical diodes may be formed to have a structure in which a first conductivity type area and a second conductivity type area are stacked in the shape of patterns.

After the step of forming the plurality of vertical diodes, the method may further include the step of stacking bottom electrodes, a phase change layer and top electrodes on the respective vertical diodes.

The bottom electrodes may be formed to have the shape of dot patterns.

The phase change layer and the top electrodes may be formed to have the shape of line type stack patterns.

In still another aspect of the present invention, a method for manufacturing a phase change memory device includes the steps of forming an SiGe layer on a semiconductor substrate having a first conductivity type well; forming an Si layer on the SiGe layer; etching primarily the Si layer and the SiGe layer and thereby defining a plurality of hole patterns between active region forming areas of the semiconductor substrate; removing portions of the SiGe layer which are exposed by the hole patterns, through wet etching; oxidating the resultant semiconductor substrate which is partially removed with the SiGe layer and thereby forming a first oxide layer on a surface of the Si layer and surfaces of the hole patterns and in spaces where the SiGe layer is removed; etching the primarily etched Si layer and SiGe layer and the semiconductor substrate, and thereby defining trenches between the active region forming areas; removing remaining portions of the SiGe layer which are exposed by the trenches, through wet etching; oxidating the resultant semiconductor substrate which is removed with the remaining portions of the SiGe layer, and thereby forming a second oxide layer on surfaces of the trenches and insulation patterns which comprise at least one of the first and second oxide layers and insulate the Si layer from the first conductivity type well; filling an insulation layer in the trenches and thereby forming an isolation structure to delimit active regions; forming second conductivity type high concentration areas in the active regions which are composed of the Si layer; and forming a plurality of vertical diodes on the second conductivity type high concentration areas.

The first conductivity type may be a P-type, and the second conductivity type may be an N-type.

The active regions may be formed into bar type active regions.

The plurality of bar type active regions are formed such that they extend in a first direction and are spaced apart from one another in a second direction perpendicular to the first direction.

The SiGe layer may be formed to a thickness in the range of 50~200 Å.

The Si layer may be formed to a thickness in the range of 400~500 Å.

The vertical diodes may be formed to have a structure in which a first conductivity type area and a second conductivity type area are stacked in the shape of patterns.

After the step of forming the plurality of vertical diodes, the method may further include the step of stacking bottom electrodes, a phase change layer and top electrodes on the respective vertical diodes.

The bottom electrodes may be formed to have the shape of a dot pattern.

The phase change layer and the top electrodes may be formed to have the shape of line type stack patterns.

In a still further aspect of the present invention, a method for manufacturing a phase change memory device includes the steps of forming an SiGe layer on a semiconductor substrate which is divided into a cell region and a peripheral region and has a first conductivity type well shared by the cell region and the peripheral region; removing a portion of the SiGe layer which is formed in the peripheral region of the semiconductor substrate; forming an Si layer on the semiconductor substrate including a portion of the SiGe layer which is formed in the cell region; etching primarily the Si layer and the SiGe layer and thereby defining a plurality of hole patterns between active region forming areas in the cell region of the semiconductor substrate; removing portions of the SiGe layer which are exposed by the hole patterns, through wet etching; oxidating the resultant semiconductor substrate which is partially removed with the SiGe layer and thereby forming a first oxide layer on a surface of the Si layer and surfaces of the hole patterns and in spaces where the SiGe layer is removed; etching the primarily etched Si layer and SiGe layer and the semiconductor substrate, and thereby defining trenches between the active region forming areas in the cell region and the peripheral region; removing portions of the SiGe layer which remain in the cell region and are exposed by the trenches, through wet etching; oxidating the resultant semiconductor substrate which is removed with the remaining portions of the SiGe layer, and thereby forming a second oxide layer on surfaces of the trenches and insulation patterns, which comprise at least one of the first and second oxide layers and insulate the Si layer from the first conductivity type well in the active region forming areas of the cell region, in areas of the cell region where the SiGe layer is removed; filling an insulation layer in the trenches and thereby forming an isolation structure to delimit active regions in the cell region and the peripheral region; forming second conductivity type high concentration areas in the active regions of the cell region which are composed of the Si layer and are insulated from the first conductivity type well by the insulation patterns; and forming a plurality of vertical diodes on the second conductivity type high concentration areas in the cell region.

The first conductivity type may be a P-type, and the second conductivity type may be an N-type.

The active regions may be formed into bar type active regions.

The plurality of bar type active regions may be formed such that they extend in a first direction and are spaced apart from one another in a second direction perpendicular to the first direction.

The SiGe layer may be formed to a thickness of 50~200 Å.

The Si layer may be formed to a thickness of 400~500 Å.

The vertical diodes may be formed to have a structure in which a first conductivity type area and a second conductivity type area are stacked in the shape of patterns.

After the step of forming the plurality of vertical diodes, the method may further include the step of stacking bottom electrodes, a phase change layer and top electrodes on the respective vertical diodes in the cell region.

The bottom electrodes may be formed to have the shape of a dot pattern.

The phase change layer and the top electrodes may be formed to have the shape of line type stack patterns.

DESCRIPTION OF SPECIFIC EMBODIMENTS

Hereafter, specific embodiments of the present invention will be described in detail with reference to the accompanying drawings.

Figure 1:
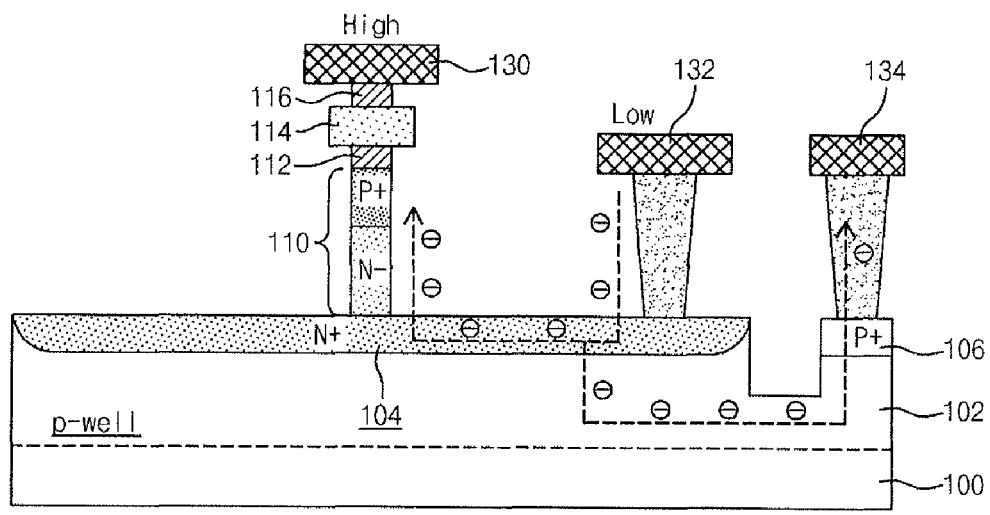
FIG. 1 is a cross-sectional view for illustrating a conventional phase change memory device and an undesired parasitic PNP bipolar transistor associated therewith.
Figure 2:
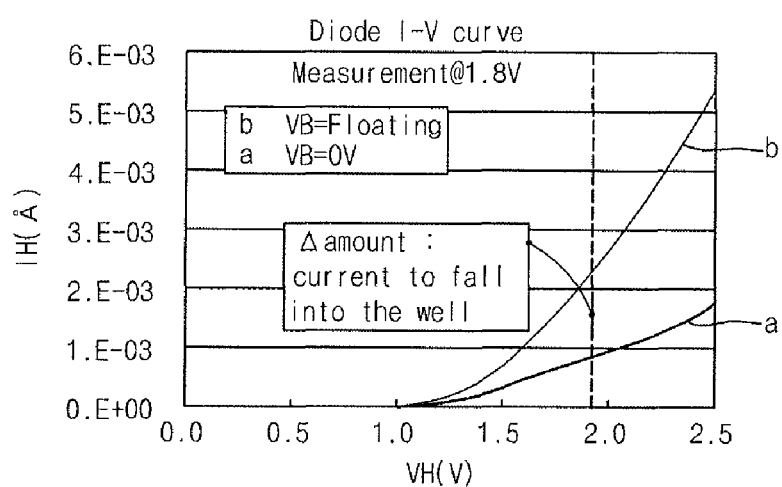
FIG. 2 is a graph shown for explaining the current loss in the conventional phase change memory device.
Figure 3:
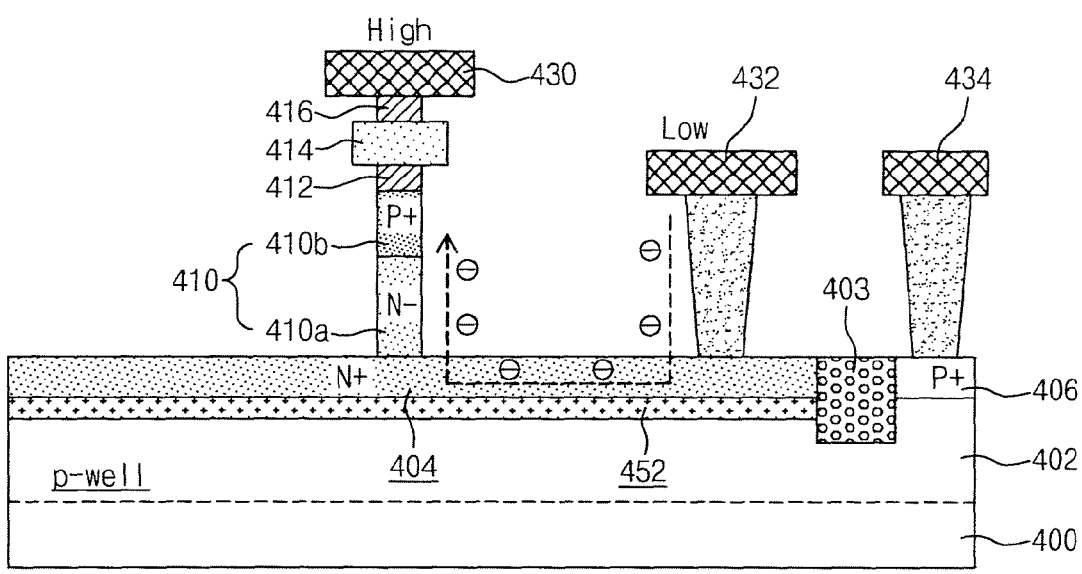
FIG. 3 is a cross-sectional view showing a phase change memory device in accordance with an embodiment of the present invention.

FIG. 3 is a cross-sectional view showing a phase change memory device in accordance with an embodiment of the present invention.

Referring to FIG. 3, a semiconductor substrate 400 has a first conductivity type well, that is, a p-well 402. An isolation structure 403 is formed in the semiconductor substrate 400 having the p-well 402 in such a way as to define active regions.

Here, while not shown in detail, the semiconductor substrate 400 is divided into a cell region and a peripheral region. The p-well 402 is formed in both the cell and peripheral regions. The isolation structure 403 is formed in and between the cell region and the peripheral region of the semiconductor substrate 400 having the p-well 402 in such a way as to define the active regions. A plurality of active regions are formed as bar type active regions in which they extend in a first direction and are spaced apart from one another in a second direction perpendicular to the first direction.

A second conductivity type highly doped area, that is, an N+ base area 404 is formed in the surface of the semiconductor substrate 400 in the cell region. An insulation pattern 452 is formed under the N+ base area 404 to insulate the N+ base area 404 from the p-well 402. The insulation pattern 452 comprises at least one of an oxide layer and a nitride layer. Preferably, the insulation pattern 452 comprises an oxide layer.

A vertical PN diode 410 serving as a switching element is formed on the N+ base area 404. The vertical PN diode 410 includes a stack of an N– silicon layer 410a and a P+ silicon layer 410b. The N– silicon layer 410a has a low impurity concentration less than that of the N+ base area 404, and the P+ silicon layer 410b has a high impurity concentration similar to that of the N+ base area 404.

A bottom electrode 412, a phase change layer 414 and a top electrode 416 are sequentially stacked on the vertical PN diode 410. Here, while not shown in detail, the bottom electrode 412 has a dot pattern shape, and the phase change layer 414 and the top electrode 416 form a line type stack pattern which extends in the direction perpendicular to the direction the bar type active regions extend.

In FIG. 3, the reference numeral 406 designates a well pick-up, 430 a bit line, 432 a word line including a contact plug, and 434 a metal line including a contact plug connected to the well pick-up 406.

The peripheral region of the semiconductor substrate 400 has a structure in which the active regions are defined on the surface of the p-well 402 without forming an insulation pattern, and driving transistors are formed in the active regions as in the conventional art.

In the phase change memory device according to an embodiment of the present invention, because an insulation pattern is formed under an N+ base area in the cell region of a semiconductor substrate in which a cell switching element is formed such that the N+ base area and a p-well are insulated from each other, it is possible to prevent an undesired parasitic PNP bipolar transistor from being formed between a vertical PN diode serving as the cell switching element and the p-well.

Accordingly, in the phase change memory device according to the present invention, current can entirely (or substantially) flow from a word line to the vertical PN diode without leaking to the p-well; and therefore, current flow to the vertical PN diode can be increased, whereby the operation characteristics of the phase change memory device can be improved when compared to the conventional art.

FIGS. 4A through 4H, FIGS. 5A through 5H, and FIGS. 6A through 6H are views shown for illustrating a method for manufacturing a phase change memory device in accordance with an embodiment of the present invention. The method will be described below. Here, FIGS. 4A through 4H are plan views shown for illustrating the processes of the method, and FIGS. 5A through 5H and FIGS. 6A through 6H are cross-sectional views taken along the lines X-X' and Y-Y', respectively, of FIGS. 4A through 4H.

Figure 4A:
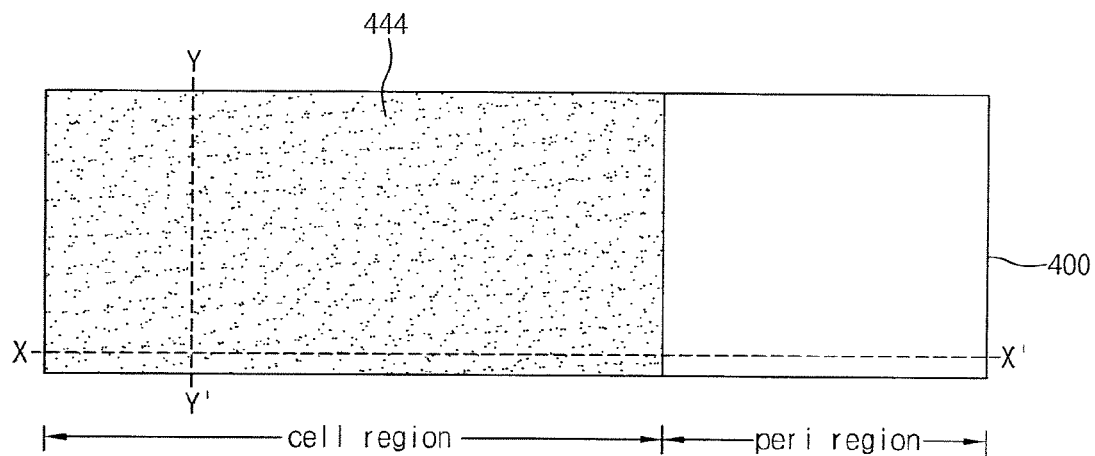
FIGS. 4A through 4H are plan views showing the processes of a method for manufacturing a phase change memory device in accordance with an embodiment of the present invention.
Figure 5A:
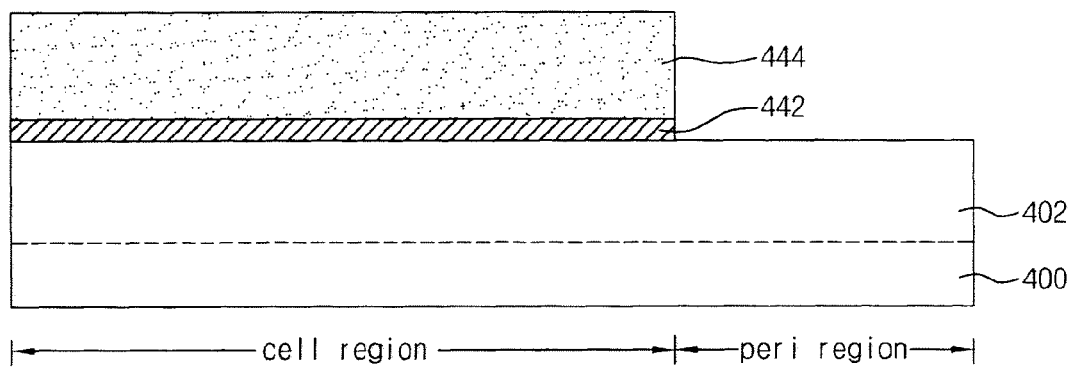
FIGS. 5A through 5H are cross-sectional views taken along the lines X-X' of FIGS. 4A through 4H.
Figure 6A:
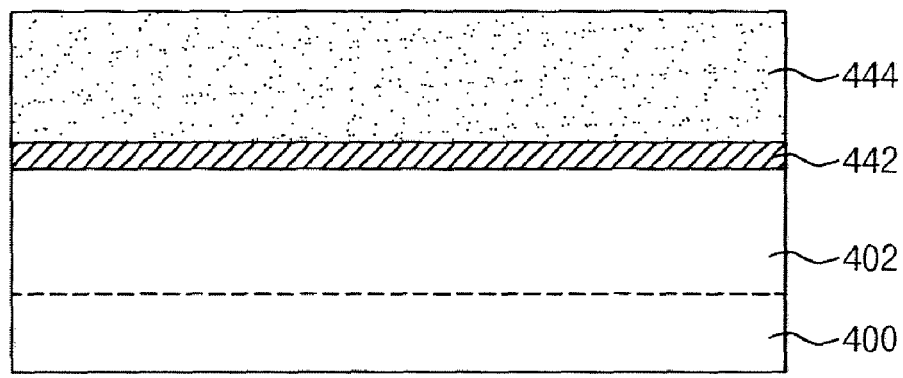
FIGS. 6A through 6H are cross-sectional views taken along the lines Y-Y' of FIGS. 4A through 4H.

Referring to FIGS. 4A, 5A and 6A, a semiconductor substrate 400, which is divided into a cell region and a peripheral region, is prepared. A first conductivity type well, that is, a p-well 402, is formed in the semiconductor substrate 400 in both regions, and then an SiGe layer 442 is formed on the semiconductor substrate 400 formed with the p-well 402. The SiGe layer 442 is formed to a thickness in the range of 50~200 Å. A mask pattern 444 is formed on the SiGe layer 442 such that the mask pattern 444 covers the cell region while exposing the peripheral region. The exposed portion of the SiGe layer 442 in the peripheral region is then etched using the mask pattern 444 as an etch mask and is thereby removed.

Figure 4B:
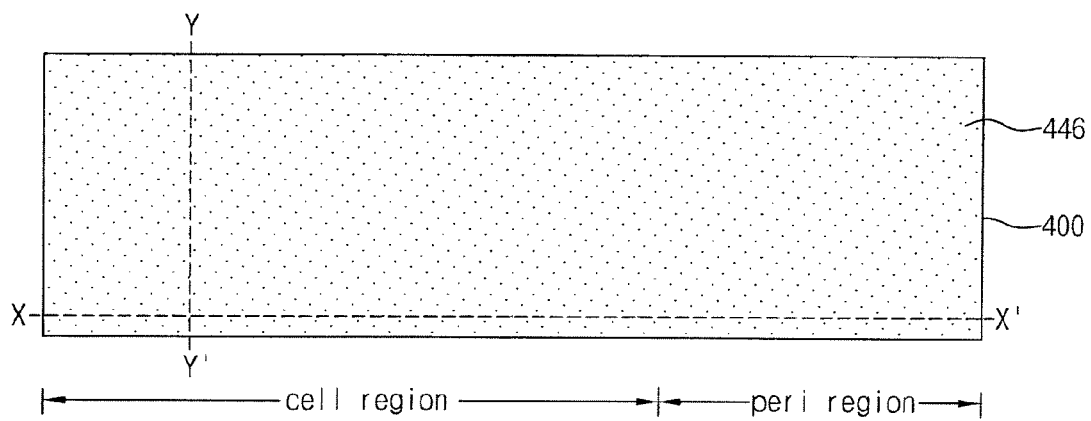
Figure 5B:
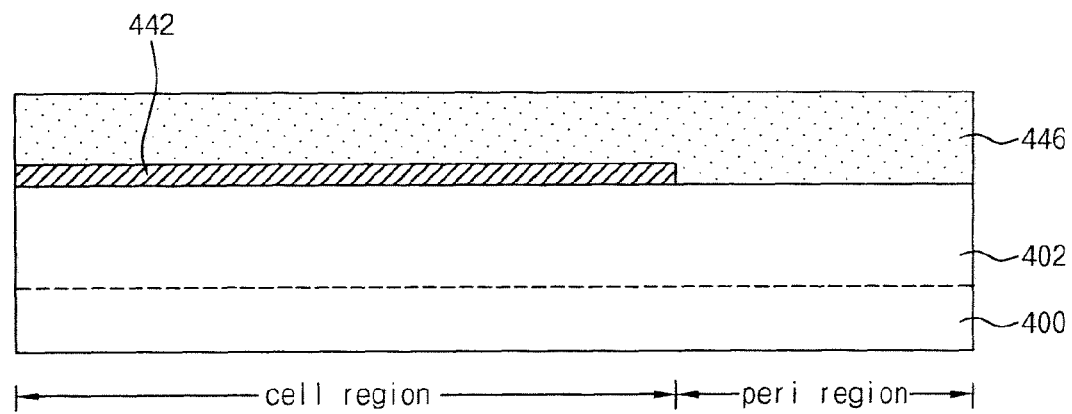
Figure 6B:
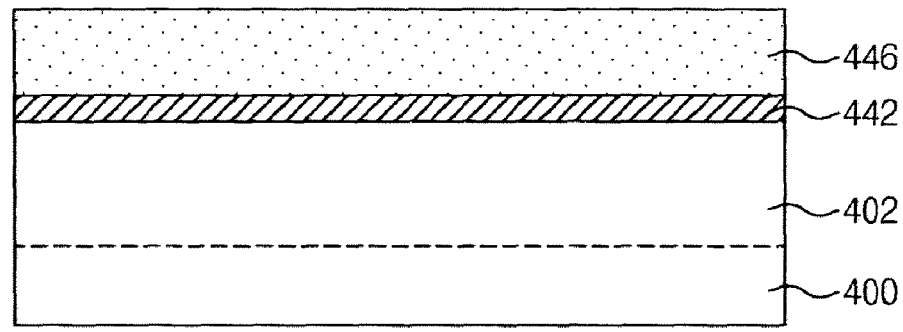

Referring to FIGS. 4B, 5B and 6B, the mask pattern 444 used as the etch mask is removed. An Si layer 446 is formed on the entire area of the semiconductor substrate 400 including on the SiGe layer 442 remaining in the cell region. The Si layer 446 is formed to a thickness that allows for a junction area to be formed therein, for example, to a thickness in the range of 400~500 Å. Further, the Si layer 446 is formed such that the surface thereof is planar.

Figure 4C:
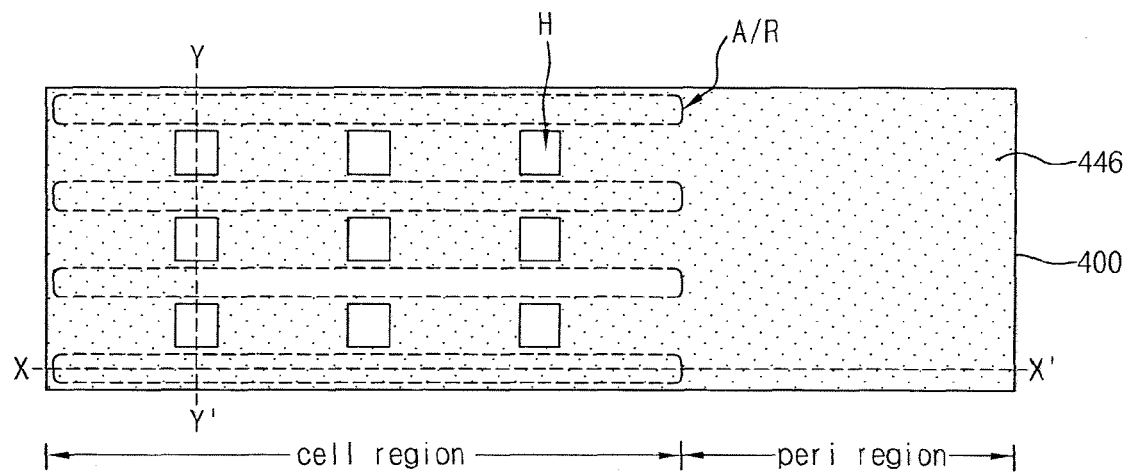
Figure 5C:
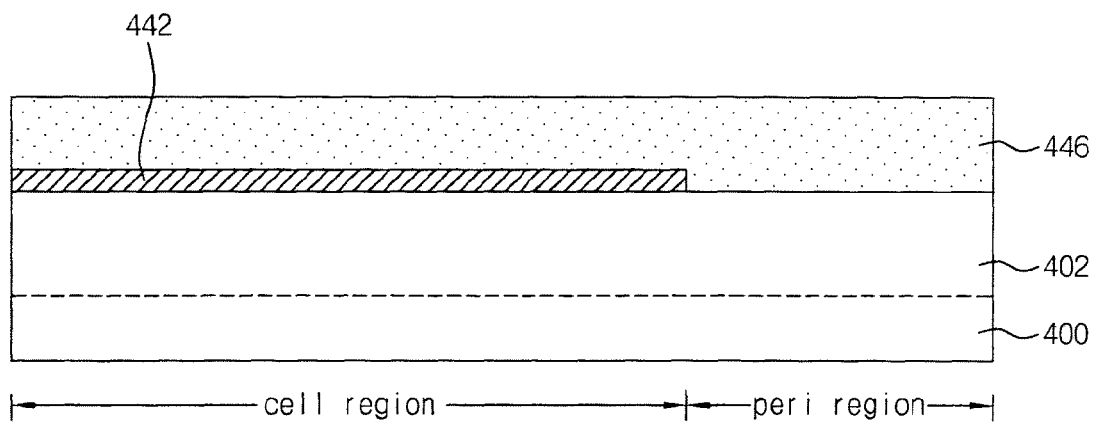
Figure 6C:
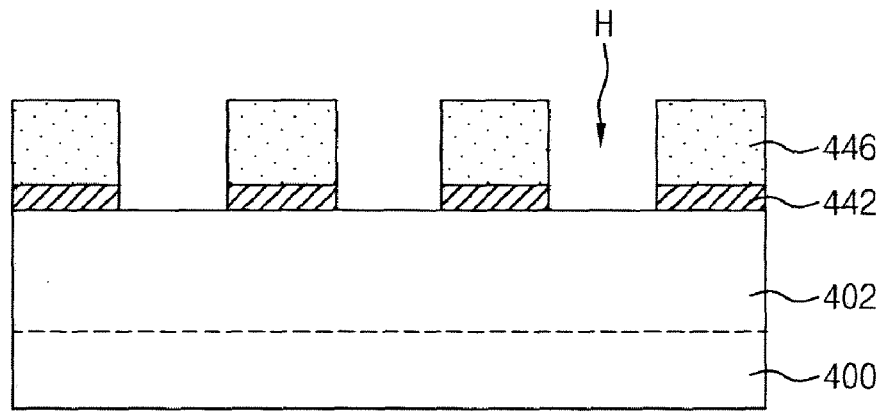

Referring to FIGS. 4C, 5C and 6C, a primary etching is conducted on the Si layer 446 and the SiGe layer 442 to form a plurality of hole patterns H that are defined between active region forming areas A/R in the cell region of the semiconductor substrate 400. Here, the reason why the primary etching is implemented not in a line type but in a hole type is because the Si layer 446 is likely to sag if the primary etching is implemented in a line type because the SiGe layer 442 positioned under the Si layer 446 is subsequently removed.

Figure 4D:
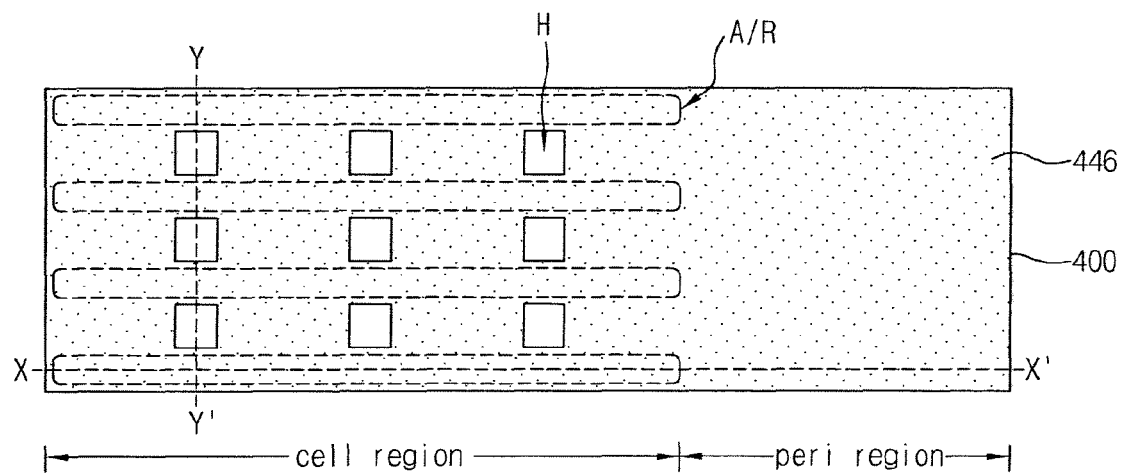
Figure 5D:
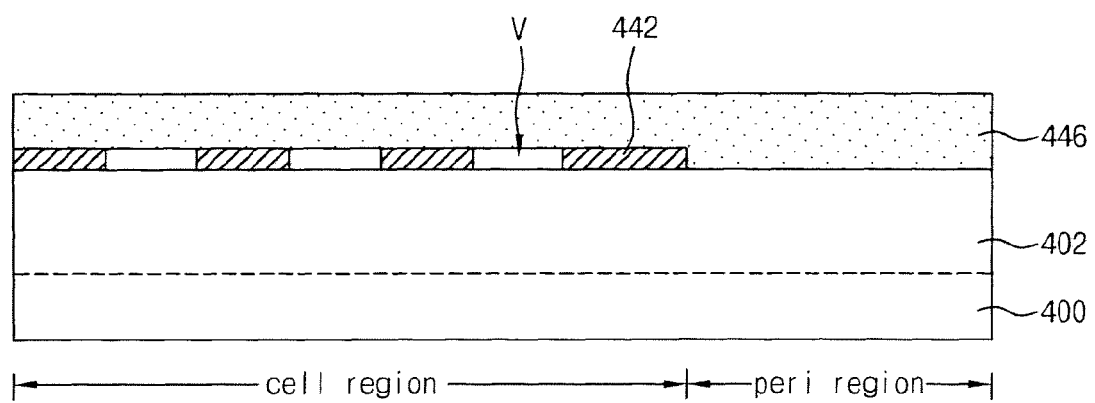
Figure 6D:
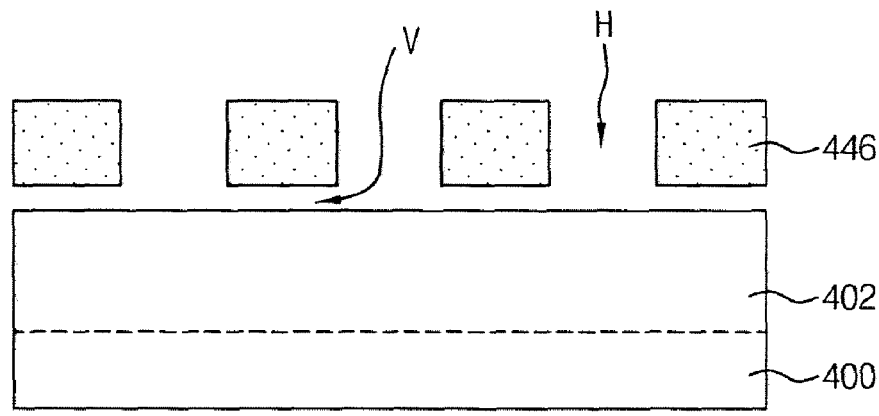

Referring to FIGS. 4D, 5D and 6D, the portions of the SiGe layer 442, which are positioned between the hole patterns H under the Si layer 446 and which substantially belong to the active region forming areas A/R are removed through wet etching, and through this, empty spaces V are defined between the semiconductor substrate 400 (which is formed with the p-well 402) and the Si layer 446 at the portions of the semiconductor substrate between hole patterns and belonging to the active region forming areas.

Figure 4E:
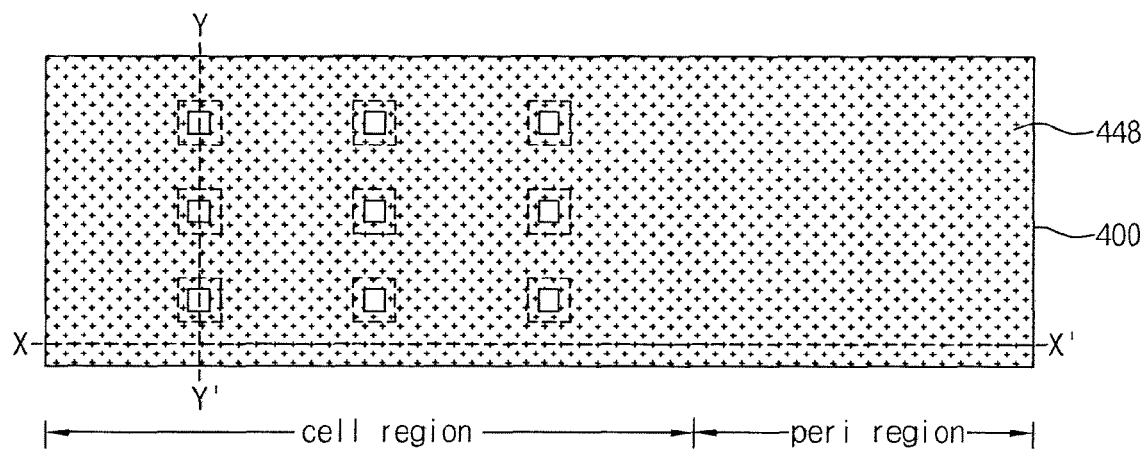
Figure 5E:
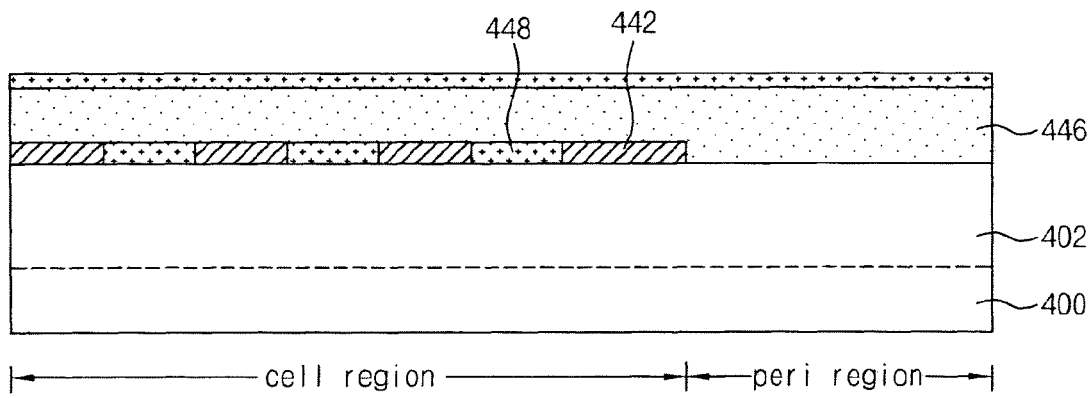
Figure 6E:
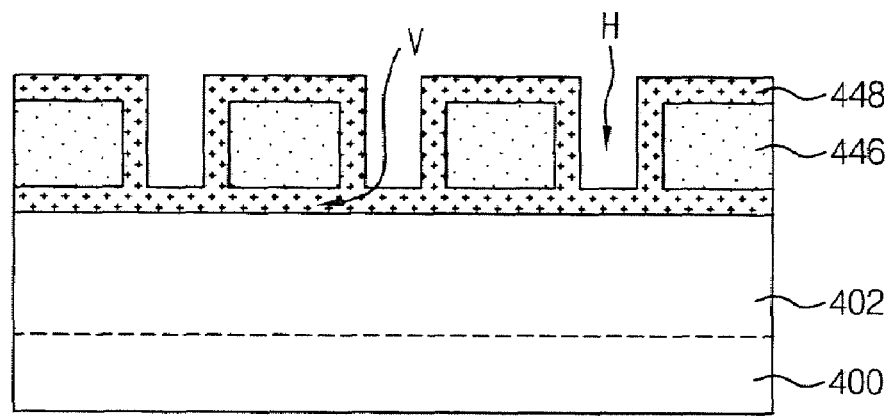

Referring to FIGS. 4E, 5E and 6E, an oxidation process is conducted on the resultant semiconductor substrate 400 (which includes the plurality of empty spaces V formed by the partial removal of the SiGe layer 442) to form a first oxide layer 448 on the surface of the Si layer 446 and the surfaces of the hole patterns H and in the empty spaces V. As such, in the areas where the SiGe layer 442 is removed, the portions of the Si layer 446 are supported by the first oxide layer 448.

Figure 4F:
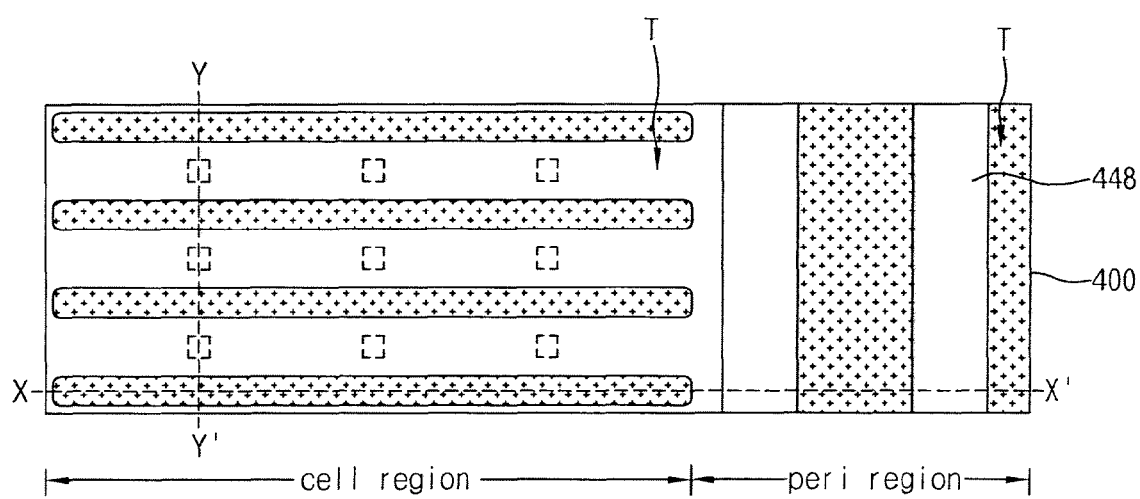
Figure 5F:
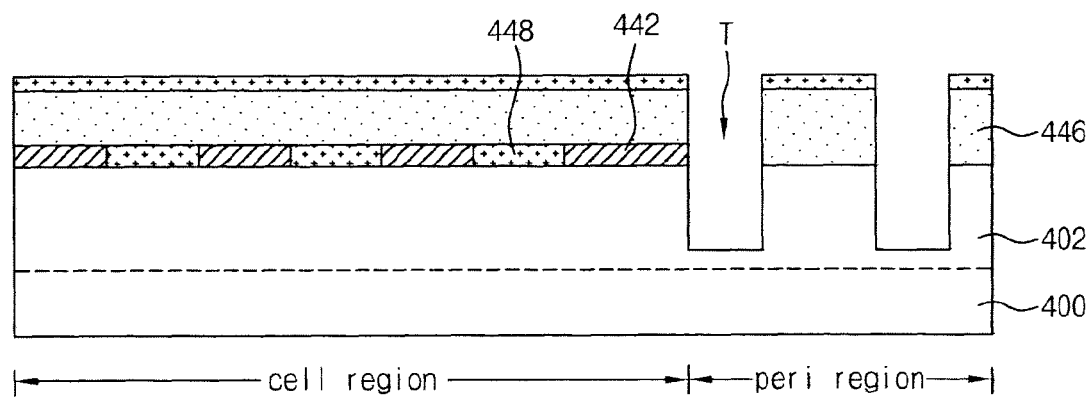
Figure 6F:
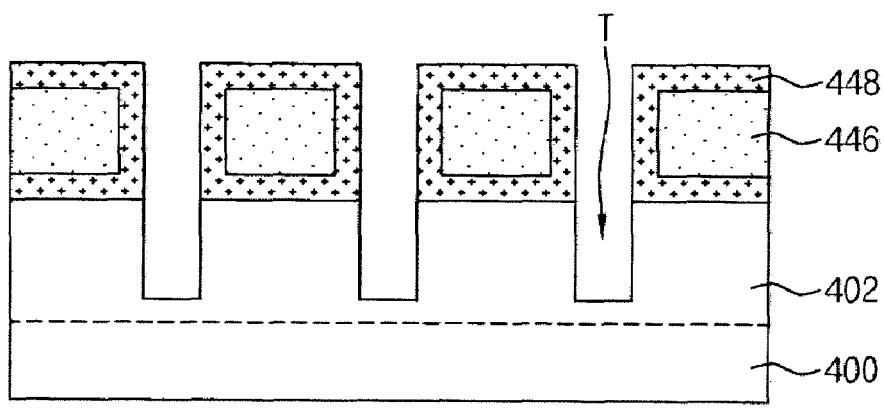

Referring to FIGS. 4F, 5F and 6F, the first oxide layer 448, the Si layer 446, the SiGe layer 442 and the semiconductor substrate 400 are etched to define trenches T between the active region forming areas in the cell region and the peripheral region. At this time, since the areas where the hole patterns H are defined by the removal of the Si layer 446 and the SiGe layer 442 through the primary etching is also secondarily etched, these areas are etched deeper than the other areas.

Figure 4G:
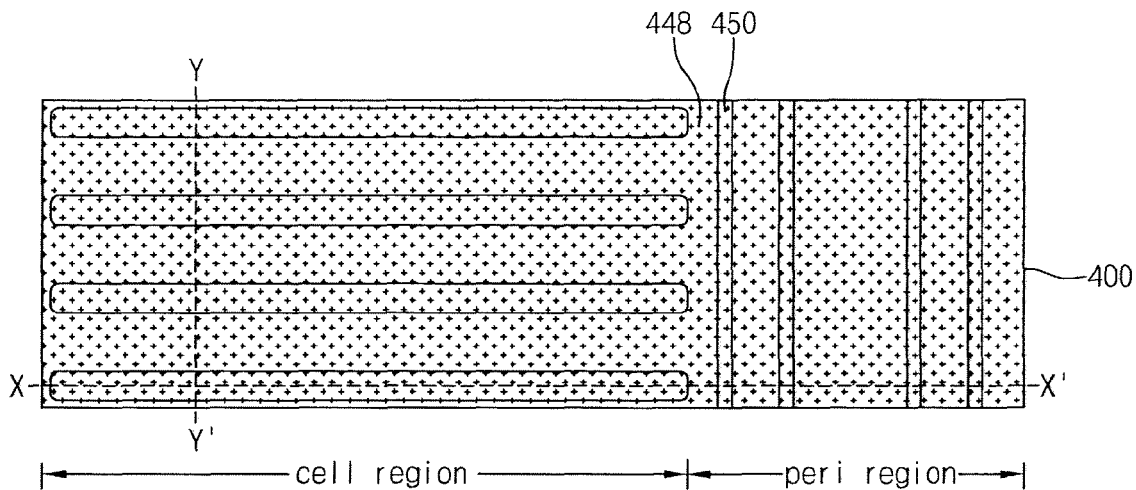
Figure 5G:
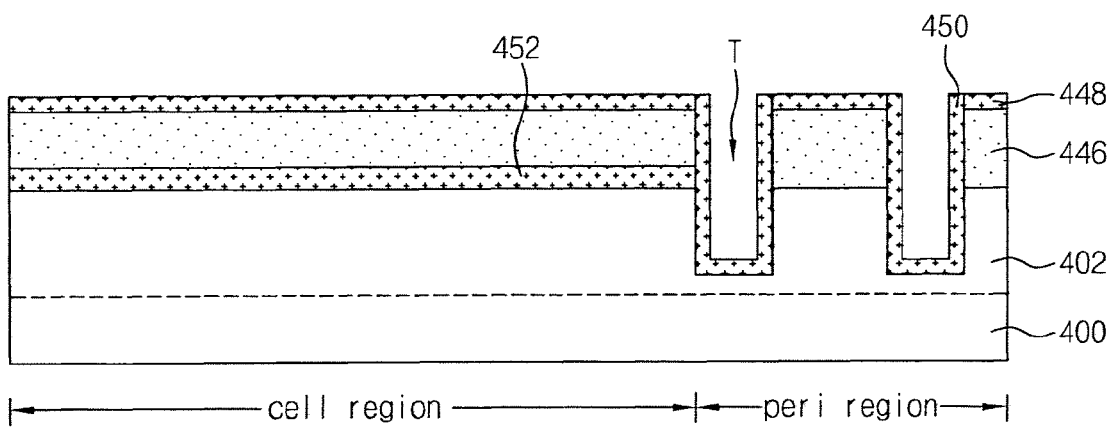
Figure 6G:
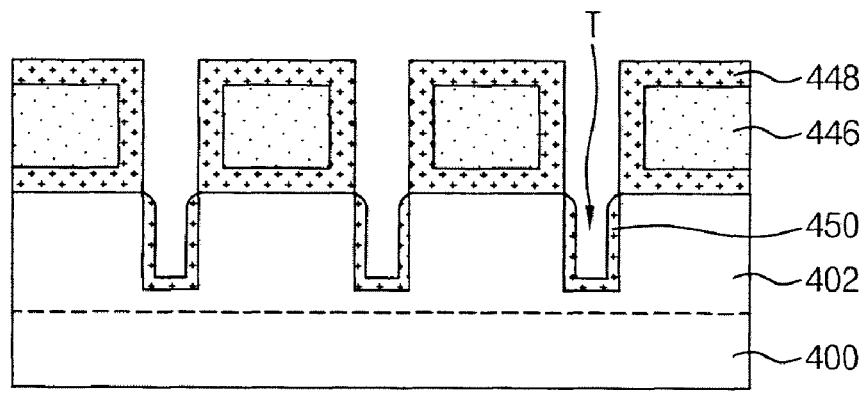

Referring to FIGS. 4G, 5G and 6G, the portions of the SiGe layer 442, which are exposed by the trenches T, are removed through wet etching. Then, another oxidation process is conducted on the resultant semiconductor substrate 400 the SiGe layer 442 removed therefrom to form a second oxide layer 450 on the surfaces of the trenches T. As a result, insulation patterns 452, which comprise at least one of the first oxide layer 448 and the second oxide layer 450 and which insulate the portions of the Si layer 446 formed in the active region forming areas of the cell region from the p-well 402, are formed in the areas where the portions of SiGe layer 442 are removed in the cell region.

Figure 4H:
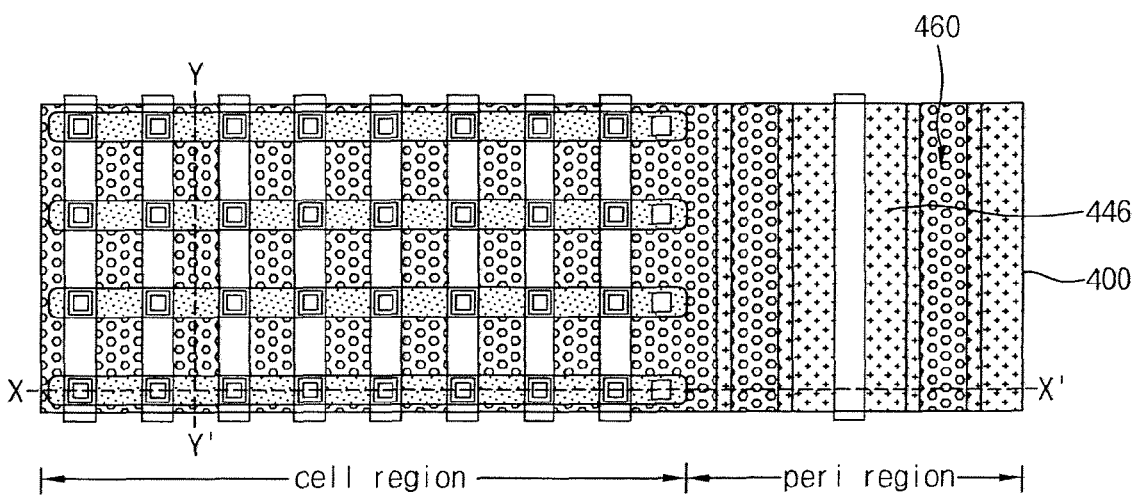
Figure 5H:
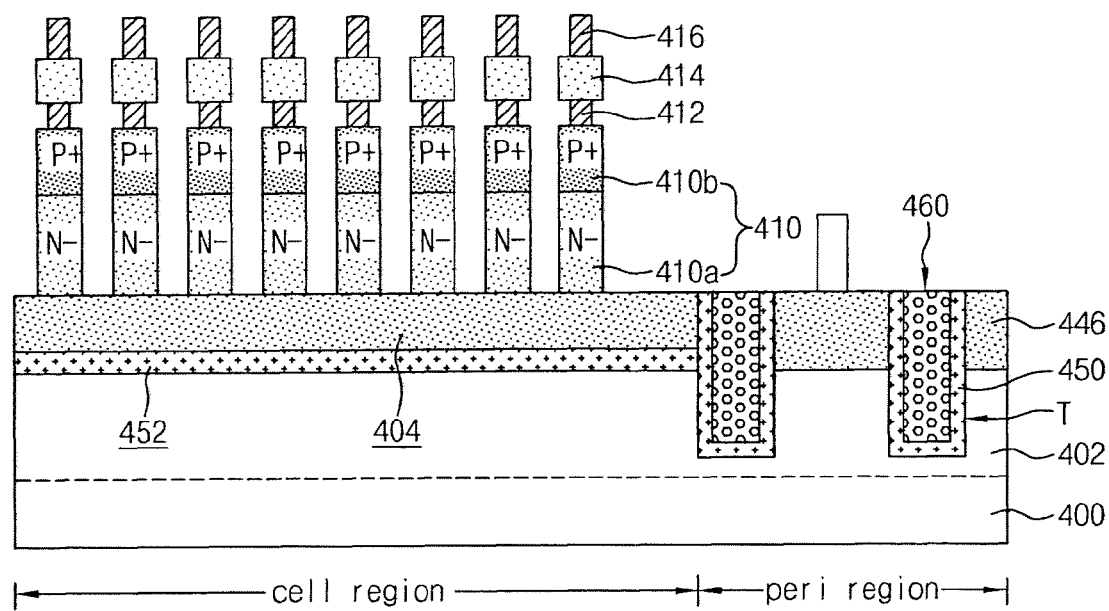
Figure 6H:
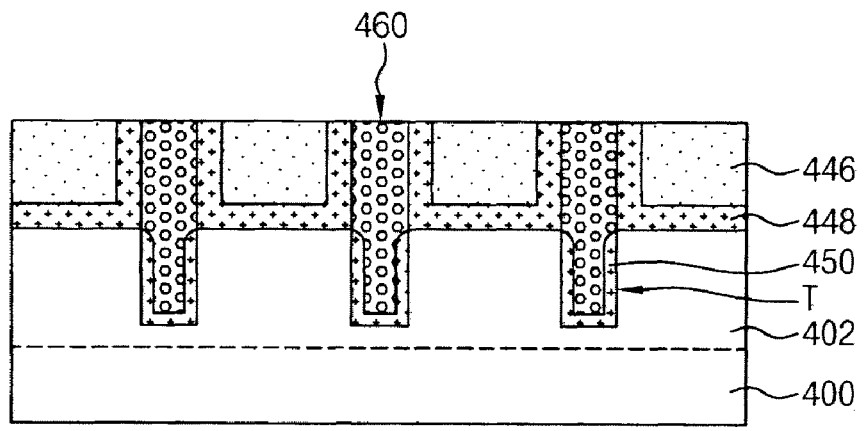

Referring to FIGS. 4H, 5H and 6H, an insulation layer is filled in the trenches T, and then planarization is implemented through a chemical mechanical polishing (CMP) process, an isolation structure 460 is formed to define active regions in the cell region and the peripheral region of the semiconductor substrate 400. At this time, in the CMP process for forming the isolation structure 460, the portions of the first and second oxide layers 448 and 450 formed on the Si layer 446 are also removed so that the surface of the Si layer 446 is exposed. The plurality of active regions extend in a first direction, and are formed as bar type active regions such that they are spaced apart from one another in a second direction perpendicular to the first direction.

The peripheral region of the semiconductor substrate 400 (which is formed with the isolation structure 460 for defining the active regions in the cell region and the peripheral region) is masked, and second conductivity type impurities, that is, N-type impurities, are ion-implanted at a high doping concentration in the exposed surface of the Si layer 446 the cell region to form N+ base areas 404 contacting the insulation patterns 452. At this time, the N+ base areas 404 and the p-well 402 are insulated from each other by the insulation patterns 452.

After removing the substance that masks the peripheral region, a plurality of vertical PN diodes 410, which include stack patterns of an N− silicon layer 410a and a P+ silicon layer 410b, are formed as cell switching elements on the N+ base areas 404 in the active regions of the cell region. Then, bottom electrodes 412, a phase change layer 414 and top electrodes 416 are sequentially formed on the respective vertical PN diodes 410. Here, the bottom electrodes 412 are formed as a dot pattern, and the phase change layer 414 and the top electrodes 416 are formed into line type stack patterns which extend in the direction perpendicular to the direction that the N+ base areas 404 extend.

Meanwhile, before forming the bottom electrodes 412, the phase change layer 414 and the top electrodes 416, it is preferred that driving transistors are formed in the peripheral region of the semiconductor substrate 400 having the vertical PN diodes 410 formed in the cell region.

Thereafter, while not shown in the drawings, by sequentially conducting a series of subsequent processes including processes for forming bit lines and word lines, the manufacturing process of a phase change memory device according to an embodiment of the present invention is completed.

While the insulation patterns were described as comprising a single oxide layer in the aforementioned embodiment, it is to be understood that a nitride layer or the stack of an oxide layer and a nitride layer can be adopted in place of the oxide layer.

As is apparent from the above description, in the present invention, insulation patterns are formed under N+ base areas and insulate vertical PN diodes from the p-well. Therefore, it is possible to prevent undesired parasitic PNP bipolar transistors from being formed between the vertical PN diodes and the p-well.

As a result, in the present invention, current can entirely flow from word lines to a phase change layer without leaking to the p-well; and thereby, current efficiency can be elevated and the operation characteristics of a phase change memory device can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A phase change memory device comprising:
    a semiconductor substrate having a first conductivity type well;
    an isolation structure formed in the semiconductor substrate to define one or more active regions;
    a second conductivity type high concentration area formed in a surface of each of the one or more active regions;
    an insulation pattern selectively formed only in the one or more active regions in a manner such that the insulation pattern is formed under each of the second conductivity type high concentration areas and over the first conductivity type well to insulate the second conductivity type high concentration area from the first conductivity type well; and
    one or more vertical diodes formed on the second conductivity type high concentration area.

2. The phase change memory device according to claim 1, wherein the first conductivity type is a P-type, and the second conductivity type is an N-type.

3. The phase change memory device according to claim 1, wherein the one or more active regions are bar type active regions.

4. The phase change memory device according to claim 3 wherein a plurality of the bar type active regions are defined by the isolation structure, and wherein the plurality of bar type active regions extend in a first direction and are spaced apart from one another in a second direction perpendicular to the first direction.

5. The phase change memory device according to claim 1, wherein the insulation pattern comprises at least one of an oxide layer and a nitride layer.

6. The phase change memory device according to claim 1, wherein the one or more vertical diodes comprise a first conductivity type area and a second conductivity type area stacked on one another.

7. The phase change memory device according to claim 1, wherein the isolation structure defines a plurality of the active regions and a plurality of the vertical diodes are formed on the second conductivity type high concentration area of each of the active regions, the phase change memory device further comprising:
    a plurality of bottom electrodes, a phase change layer and a plurality of top electrodes stacked on the vertical diodes.

8. The phase change memory device according to claim 7, wherein the bottom electrodes form a dot pattern.

9. The phase change memory device according to claim 7, wherein the phase change layer and the top electrodes are formed as line type stack patterns extending across the plurality of active regions.

10. A phase change memory device including a semiconductor substrate divided into a cell region and a peripheral region, the phase change memory device comprising:
    a first conductivity type well shared by the cell region and the peripheral region;
    a plurality of active regions defined by an isolation structure formed in and between the cell and peripheral regions of the semiconductor substrate;
    second conductivity type high concentration areas respectively formed in surfaces of the active regions of the cell region;
    insulation patterns selectively formed only in the active regions in a manner such that the insulation patterns are formed under the second conductivity type high concentration areas to insulate the second conductivity type high concentration areas from the first conductivity type well;
    a plurality of vertical diodes formed on the second conductivity type high concentration areas insulated from the first conductivity type well; and
    bottom electrodes, a phase change layer and top electrodes stacked on the vertical diodes.

11. The phase change memory device according to claim 10, wherein the first conductivity type is a P-type, and the second conductivity type is an N-type.

12. The phase change memory device according to claim 10, wherein the active regions are bar type active regions.

13. The phase change memory device according to claim 12, wherein the plurality of bar type active regions extend in a first direction and are spaced apart from one another in a second direction perpendicular to the first direction.

14. The phase change memory device according to claim 10, wherein the insulation patterns comprise at least one of an oxide layer and a nitride layer.

15. The phase change memory device according to claim 10, wherein the vertical diodes comprise a first conductivity type area and a second conductivity type area stacked on one another.

16. The phase change memory device according to claim 10, wherein the bottom electrodes form a dot pattern.

17. The phase change memory device according to claim 10, wherein the phase change layer and the top electrodes are formed as line type stack patterns extending across the plurality of active regions.

18. A method for manufacturing a phase change memory device including a semiconductor substrate with a first conductivity well, comprising the steps of:
- forming an isolation structure in the semiconductor substrate to define one or more active regions;
- forming a second conductivity type high concentration area in a surface of each of the one or more active regions;
- selectively forming an insulation pattern only in the one or more active regions in a manner such that the insulation pattern is formed under each of the second conductivity type high concentration areas to insulate the second conductivity type high concentration areas from the first conductivity type well; and
- forming one or more vertical diodes on the second conductivity type high concentration area.

19. The method according to claim 18, wherein the first conductivity type is a P-type, and the second conductivity type is an N-type.

20. The method according to claim 18, wherein the one or more active regions are bar type active regions.

21. The method according to claim 20, wherein a plurality of the bar type active regions are defined by the isolation structure, and the plurality of bar type active regions are formed such that they extend in a first direction and are spaced apart from one another in a second direction perpendicular to the first direction.

22. The method according to claim 18, wherein the insulation patterns comprise at least one of an oxide layer and a nitride layer.

23. The method according to claim 18, wherein the one or more vertical diodes are formed to comprise a first conductivity type area and a second conductivity type area stacked on one another.

24. The method according to claim 18, wherein the isolation structure is formed to define a plurality of the active regions and a plurality of the vertical diodes are formed on the second conductivity type high concentration area of each of the active regions, and wherein:
- after the step of forming the plurality of vertical diodes, the method further comprises the step of stacking bottom electrodes, a phase change layer and top electrodes on the vertical diodes.

25. The method according to claim 24, wherein the bottom electrodes form a dot patterns.

26. The method according to claim 24, wherein the phase change layer and the top electrodes are formed are formed as line type stack patterns extending across the plurality of active regions.

* * * * *